United States Patent
Gau et al.

(10) Patent No.: US 6,204,108 B1
(45) Date of Patent: Mar. 20, 2001

(54) METHOD OF FABRICATING A DYNAMIC RANDOM ACCESS MEMORY CAPACITOR

(75) Inventors: Jing-Horng Gau, Nan-Tou Hsien; Hsiu-Wen Huang, Kaohsiung, both of (TW)

(73) Assignee: United Semiconductor Corp., Hsinchu (TW)

( * ) Notice: Subject to any disclaimer, the term of this patent is extended or adjusted under 35 U.S.C. 154(b) by 0 days.

(21) Appl. No.: 09/213,783

(22) Filed: Dec. 17, 1998

(30) Foreign Application Priority Data

Jul. 16, 1998 (TW) .................................. 87111581

(51) Int. Cl.[7] .................. H01L 21/8234; H01L 21/8244
(52) U.S. Cl. ........................ 438/238; 438/239; 438/255
(58) Field of Search .................................. 438/238, 239, 438/254, 255, 398

(56) References Cited

U.S. PATENT DOCUMENTS

| | | | | |
|---|---|---|---|---|
| 5,278,091 | * | 1/1994 | Fazan et al. | 438/398 |
| 5,814,549 | * | 9/1998 | Wu | 438/398 |
| 5,843,822 | * | 12/1998 | Hsia et al. | 438/254 |
| 5,907,774 | * | 5/1999 | Wise | 438/254 |

* cited by examiner

Primary Examiner—Richard Elms
Assistant Examiner—Christian D. Wilson
(74) Attorney, Agent, or Firm—Jiawei Huang; J C Patents

(57) ABSTRACT

A method of fabricating a capacitor. A crown-shape bottom storage node is formed on a conductive region. The crown-shape bottom storage node has a wavelike interior surface and a hemi-spherical grained exterior surface. A dielectric layer is formed on the bottom storage node, and a top electrode is formed to cover the dielectric layer.

14 Claims, 5 Drawing Sheets

METHOD OF FABRICATING A DYNAMIC RANDOM ACCESS MEMORY CAPACITOR

CROSS-REFERENCE TO RELATED APPLICATION

This application claims the priority benefit of Taiwan application serial no. 87111581, filed Jul. 16, 1998, the full disclosure of which is incorporated herein by reference.

BACKGROUND OF THE INVENTION

1. Field of Invention

The present invention relates to a semiconductor fabricating method. More particularly, the present invention relates to a method of forming a capacitor.

2. Description of Related Art

Dynamic Random Access Memory (DRAM) devices are used in wide range of electronics applications. DRAMs are designed mainly for the purpose of storing data. The operations on a memory device includes reading the data stored in the device, writing (or storing) data in the device, and refreshing the data periodically.

A capacitor being charged/discharged to determine a logic 1 or a logic 0 is incorporated in a DRAM cell. Due to the increasing number of semiconductor elements incorporated in integrated circuits, the size of DRAM cell is decreased. As the size of DRAM memory cell is decreased, the effective area available for forming capacitors decreases. As a consequence, the capacitors are formed with a shrunk surface area, that is, a contact area with a decreased capacitance. As the capacitance is reduced, the capacity of a datum stored in a DRAM cell is decreased.

FIG. 1 is a cross-sectional view of a portion of semiconductor device showing a conventional hemi-spherical grain capacitor.

In FIG. 1, a semiconductor substrate having a source/drain region 104 is provided. An isolation layer 106 is formed on the semiconductor substrate 100. A via opening 110 is formed in the isolation layer 106 to expose the source/drain region 104. A crown-shape bottom storage node 108 is formed over on the isolation layer 106 to fill the via opening 110. A hemi-spherical grain structure is formed only on the bottom inner side wall of the bottom storage node 108. With the formation of the hemi-spherical grain structure, the effective contact area of the bottom storage node 108 is increased. With an increased effective contact area, the capacitance of capacitor is increased.

In the conventional capacitor, the hemi-spherical grain structure 110 is not formed on the inner surfaces of the bottom storage node 108. Thus, the increase of the effective contact area is limited. As a consequence, the increase of capacitance is limited as well.

SUMMARY OF THE INVENTION

Accordingly, the present invention is to provide an improved method of fabricating a capacitor with an enhanced capacity of data storage. A crown-shape bottom storage node is formed on the source/drain region. The crown-shape bottom storage node is formed with a wavelike interior surface and an outer surface with a hemispherical grain structure. With the wavelike interior surface and the hemispherical on the outer surface, the bottom storage node has an effectively increased contact area.

It is an object of the invention to provide a method for forming a capacitor to coupled with a conductive region on a substrate. A dielectric layer and a barrier layer are formed with an opening to expose the conductive region. The opening is filled with a conductive plug, while the barrier layer is covered by a first polysilicon layer. A hemi-spherical grain structure is formed on the first polysilicon layer. A composite layer comprises several different material layers is formed on the hemi-spherical grain structure. The composite layer and the first polysilicon layer are etched. The remaining composite layer and the first polysilicon layer aligned over the conductive region with a substantially smooth side surface. The composite layer is further etched by wet etching, so that portions of the composite and the first polysilicon layer are removed to formed a wavelike side surface. A second polysilicon layer is formed to cover the composite layer and is conformal to the wavelike side surface. The composite layer is removed to leave the remaining first polysilicon layer and the second polysilicon layer as a bottom electrode. A dielectric layer and a top electrode are formed to cover the bottom electrode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
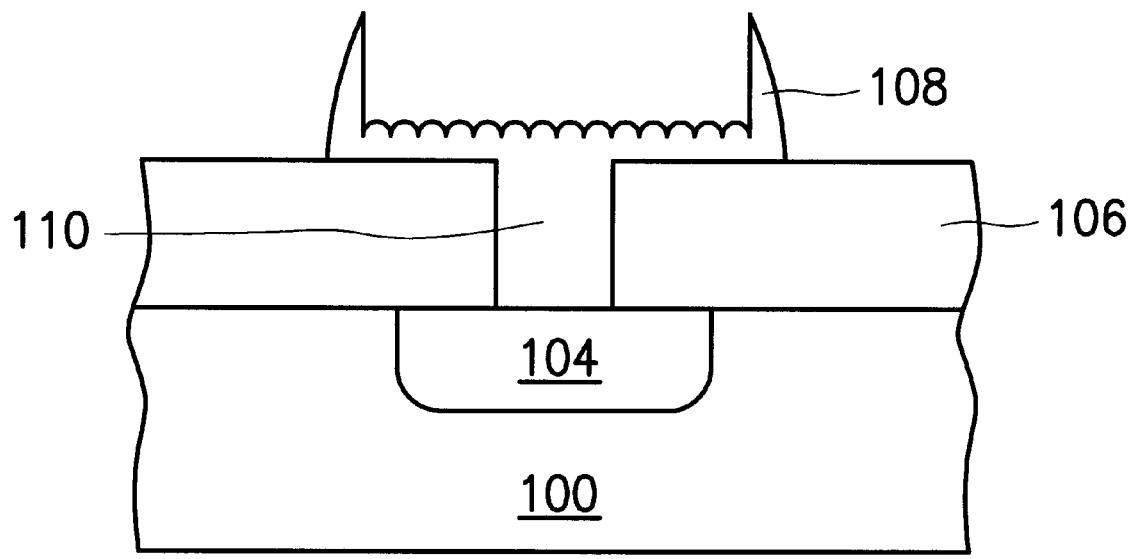
FIG. 1 is a cross-sectional view of a portion of semiconductor device showing a conventional hemi-spherical grain capacitor.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are cross-sectional views of a portion of a semiconductor device showing a capacitor according to one preferred embodiment of the invention.

Figure 2A:
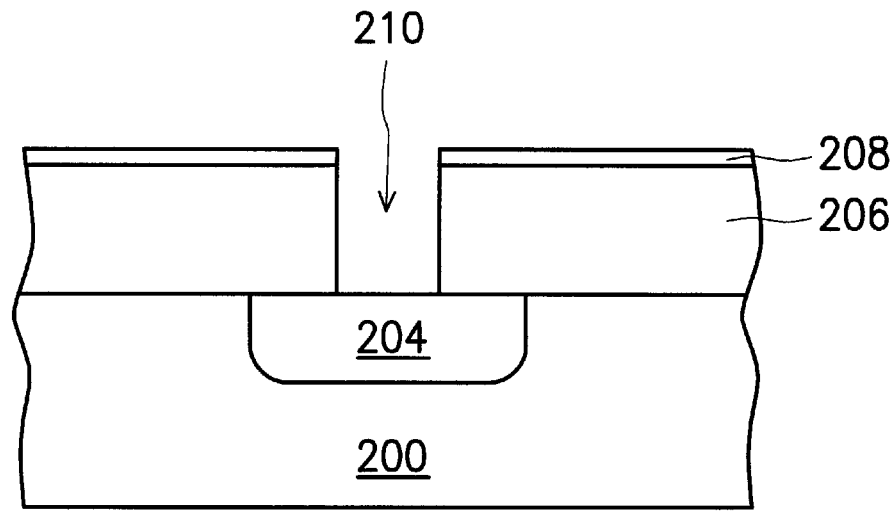
FIGS. 2A through 2H are cross-sectional views of a portion of a semiconductor device showing a capacitor according to one preferred embodiment of the invention.

In FIG. 2A, a semiconductor substrate 200 having a conductive region 204, for example, a source/drain region, is provided. An isolation layer 206 is formed on the substrate 200. A barrier layer 208 is formed on the isolation layer 206. The barrier layer 208 may be, for example, a nitride oxide silicon layer. As it is to be seen as follows, the barrier layer 208 may also be used as a bottom anti-reflect layer in the following step. An opening 210 is formed penetrating through the barrier layer 208 and the isolation layer 206 to expose the conductive region 204 using the photolithography and etching process.

Figure 2B:
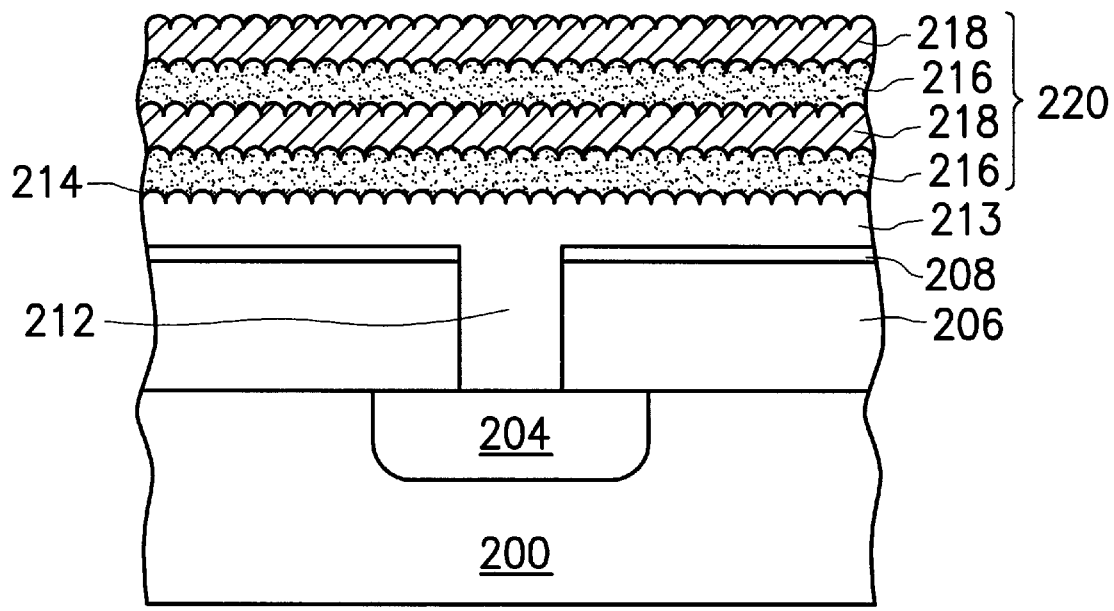

In FIG. 2B, the opening 210 is filled with a conductive plug 212, for example, a polysilicon plug, to couple with the conductive region 204, while the insulation layer 206 is covered by a first polysilicon layer 213. A hemi-spherical grain structure 214 is formed on the first polysilicon layer 213 in order to increase the effective contact area. A composite layer 220 comprising several layers formed from different materials is formed on the hemi-spherical grain structure 214. As shown in the figure, the embodiment adapts a combination of two layers formed of different materials. That is, a first material layer 216, for example, an oxide layer ($SiO_2$), and a second material layer 218, for example, a nitride layer ($Si_3N_4$) or a silicon-oxy-nitride (SiON), alternately on the hemi-spherical grain structure 214. In this embodiment, as shown in the figure, the first material layer 216 is formed on the hemi-spherical grain structure 214 and is underlying the second material layer 218. It is to be noted that the composite layer 220 my also be formed by forming the second material layer 218 on the hemi-spherical grain structure 214 and is underlying the first material layer 216. The composite layer 220 comprises the first material layer 216 and second material layer 218 arranged alternately on the hemispherical grain structure 214. Thus, while performing an etching process on the composite layer 220, the composite layer 220 has an etching rate different from the second material layer 218. Alternatively, the composite layer 220 may be replaced by a composite layer of oxide layers with a structure similar to super-lattice. That is, a first oxide layer is formed on the hemispherical grain structure 214 with a thickness of about hundreds of angstroms. Another oxide layer with different component proportion is formed on the first oxide layer. Again, with this kind of composite layer, different etching rates are obtained in different layers.

Figure 2C:
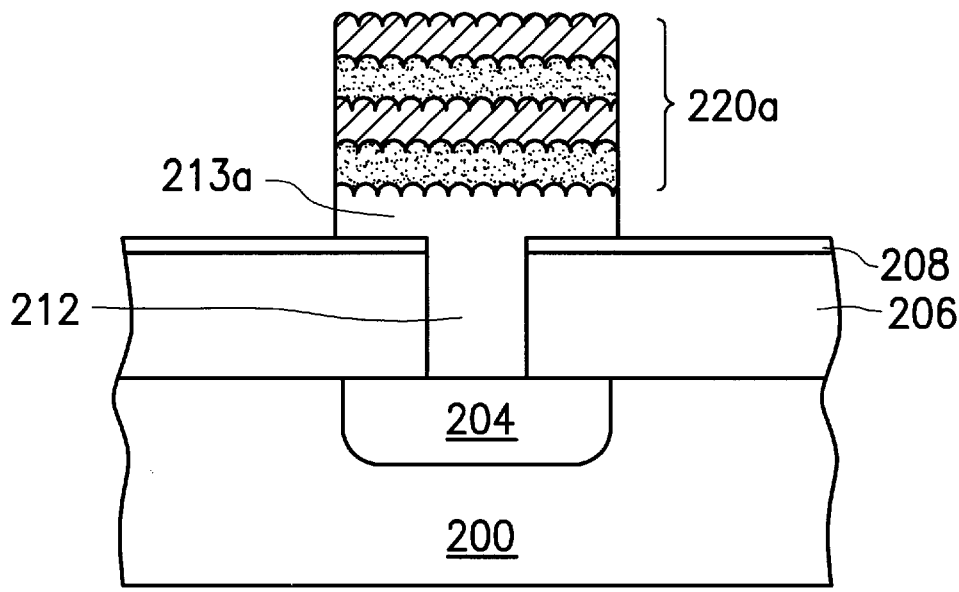

In FIG. 2C, using photolithography and anisotropic etching, portions of the composite layer 220 and the polysilicon layer 213 are removed until the barrier layer 208 is exposed. In addition to the function as an etching stop for the anisotropic etching, the barrier layer 208 is also functioned as a bottom anti-reflective layer during exposure of photolithography. The remaining composite layer 220a and the remaining polysilicon layer 213a is aligned over the source/drain region 204. As the composite layer 220 (FIG. 2B) is etched layer by layer using anisotropic etching, the composite layer 220a thus has a substantially smooth side wall as shown in the figure.

Figure 2D:
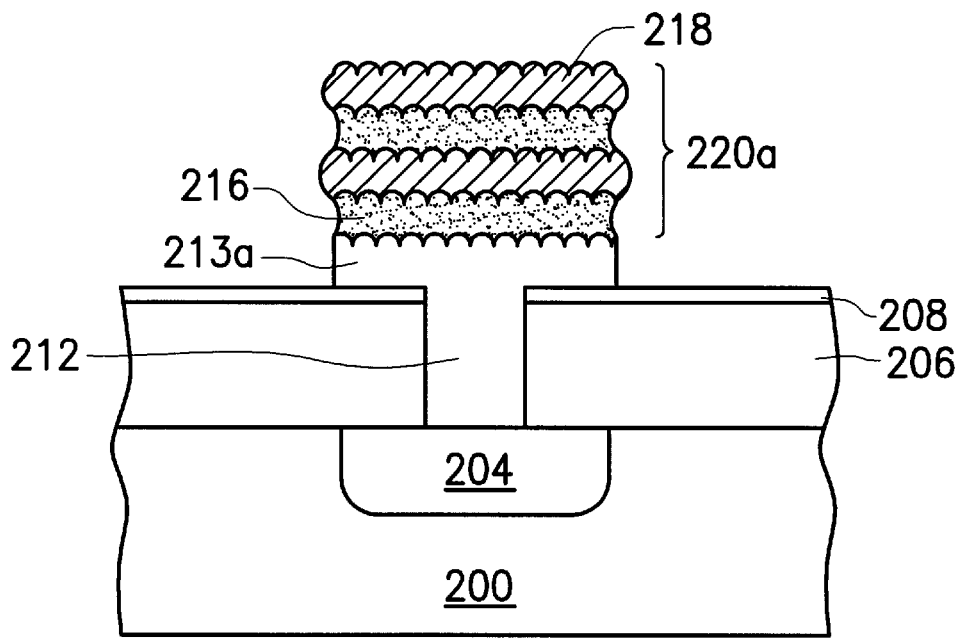

In FIG. 2D, the remaining composite layer 220a is further etched by a single wet etching process. As mentioned above, the composite layer 220a are formed by alternate first and second material layers. The etching rate is thus different in different material layer. That is, the portion of the first material layer 216 to be removed is different from the portion of the second material layer 218. As a consequence, a wavelike side wall of the composite layer 220a is formed.

Figure 2E:
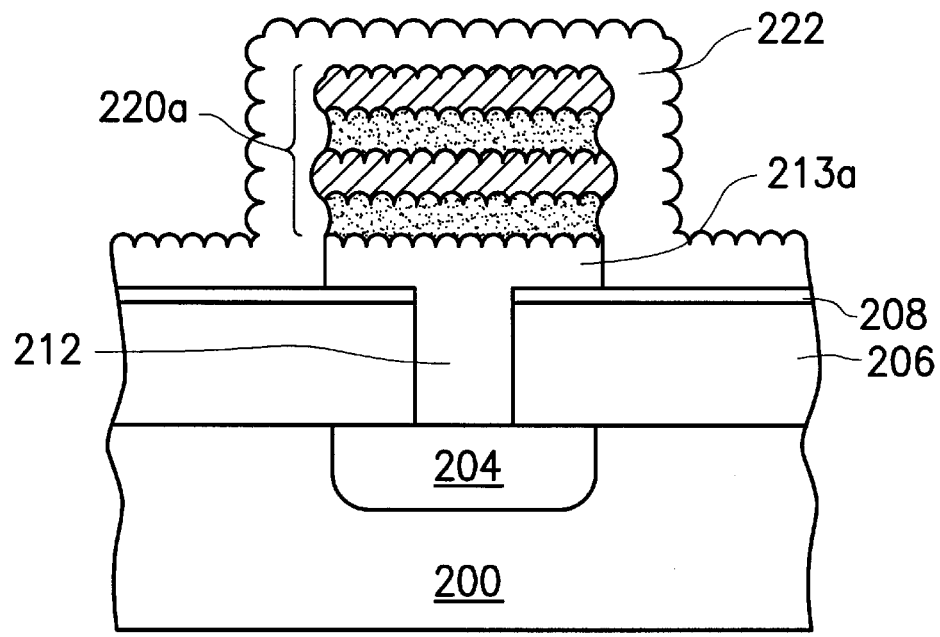

In FIG. 2E, a second polysilicon layer 222 is formed to cover the barrier layer 208 and the composite layer 220a. The second polysilicon layer 222 is conformal to the wavelike side surface and is formed with a hemispherical grain surface.

Figure 2F:
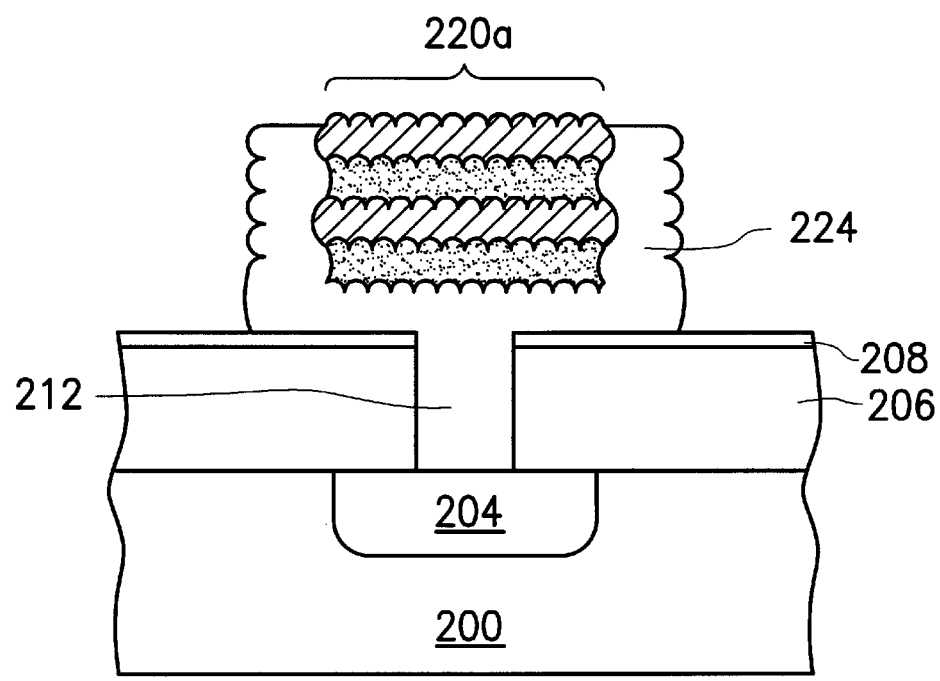

In FIG. 2F, the second polysilicon layer 222 is etched until the barrier 208 and the top surface of the composite layer 220a are exposed. The remained second polysilicon layer and the remained first polysilicon layer are then combined as denoted as 224.

Figure 2G:
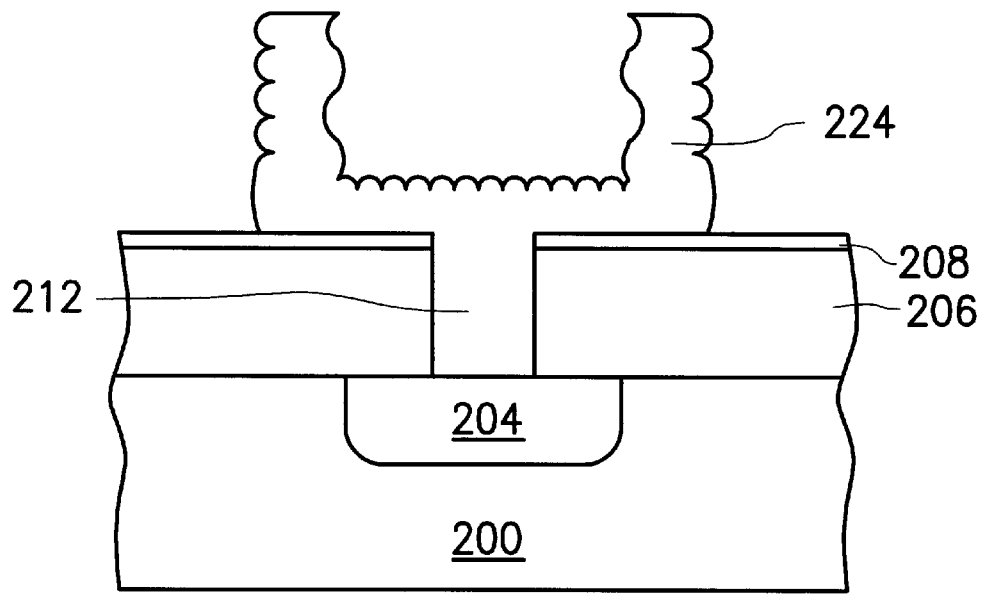

In FIG. 2G, the composite layer 220a is removed by, for example, using a wet etching method. A crown-shape bottom storage node 224, that is, a bottom electrode, is formed. The bottom storage node has a exterior hemispherical grained surface and a wavelike interior surface. Thus, compared to the bottom electrode formed by the conventional method, the effective contact area of bottom storage node 224 is effectively increased.

Figure 2H:
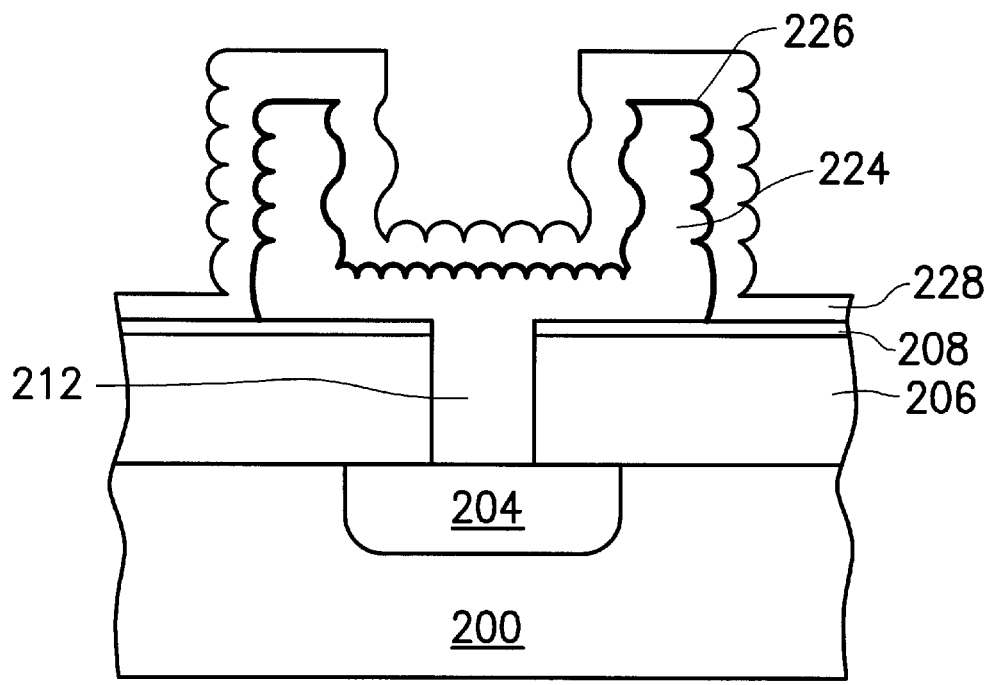

In FIG. 2H, a dielectric layer 226, for example, an oxide/nitride/oxide (ONO) layer, 226 is formed to cover the bottom storage node 224. A top electrode 228, for example, a polysilicon layer, is formed to cover the dielectric layer 226, so that a capacitor comprising the bottom storage node 224, the dielectric layer 226, and the top electrode 228 is formed In summary, the present invention provides a bottom electrode of a capacitor having wavelike interior surface of the crown-shape bottom storage node and a hemispherical grained exterior surface. Thus, the effective contact area of bottom storage node is increased. With an increased effective contact area, the effective capacitance increases.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a capacitor coupled to a conductive region on a substrate, comprising:

forming an insulation layer on the substrate;

forming a barrier layer on the insulation layer;

forming an opening penetrating through the barrier layer and the insulation to expose the conductive region;

forming a conductive plug to fill the opening and a first polysilicon layer with a hemi-spherical grained surface on the barrier layer;

forming a composite layer comprising a plurality of material layers formed by different materials on the hemi-spherical grained surface;

anisotropically etching the composite layer and the polysilicon layer until exposing the barrier layer to form a substantially smooth side surface of the composite layer;

wet etching the composite layer;

forming a second polysilicon layer with a hemi-spherical grained surface to cover the composite layer;

removing the composite layer;

forming a dielectric layer to cover the first and the second polysilicon layer; and forming a top electrode layer on the dielectric layer.

2. The method of claim 1, wherein the conductive region includes a source/drain region.

3. The method of claim 1, wherein the barrier layer includes a silicon-oxynitride layer.

4. The method of claim 1, wherein the composite layer comprises at least one first material layer and at least one second material layer formed alternately on the first polysilicon layer.

5. The method of claim 4, wherein the first material layer and the second material layer comprise an oxide layer and a nitride layer respectively.

6. The method of claim 4, wherein the first material layer and the second material layer comprises an oxide layer and a silicon-oxy-nitride layer respectively.

7. The method of claim 1, wherein the composite layer comprises a super lattice structure of oxide layers.

8. A method of forming a bottom electrode coupled with a conductive region on a substrate, comprises the steps of:

forming an insulation layer and a barrier layer on the substrate with an opening exposing the conductive region;

forming a first polysilicon layer on the barrier layer to fill the opening, the first polysilicon having a hemi-spherical grained surface;

forming a composite layer with a wavelike side surface;

forming a second polysilicon layer conformal to the composite layer, the second polysilicon layer having a hemi-spherical grained surface; and removing the composite layer.

9. The method of claim 8, wherein the barrier layer includes a silicon-oxy-nitride layer.

10. The method of claim 8, comprising further the steps for forming the composite layer with the wavelike side surface:

forming a composite layer comprising a plurality of different material layers;

etching the composite layer and the first polysilicon layer to expose a side surface of the composite layer; and further etching the composite layer using wet etching.

11. The method of claim 8, wherein the composite layer comprises at least one first material layer and at least one second material layer formed alternately on the first polysilicon layer.

12. The method of claim 11, wherein the first material layer and the second material layer comprise an oxide layer and a nitride layer respectively.

13. The method of claim 11, wherein the first material layer and the second material layer comprises an oxide layer and a silicon-oxy-nitride layer respectively.

14. The method of claim 8, wherein the composite layer comprises a super lattice structure of oxide layers.

* * * * *